US010566271B2

(12) United States Patent
Tsai et al.

(10) Patent No.: US 10,566,271 B2
(45) Date of Patent: Feb. 18, 2020

(54) CARRIER-FREE SEMICONDUCTOR PACKAGE AND FABRICATION METHOD

(71) Applicant: Siliconware Precision Industries Co., Ltd., Taichung (TW)

(72) Inventors: Yueh-Ying Tsai, Taichung (TW); Fu-Di Tang, Taichung (TW); Chien-Ping Huang, Taichung (TW); Chun-Chi Ke, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 93 days.

(21) Appl. No.: 15/467,198

(22) Filed: Mar. 23, 2017

(65) Prior Publication Data

US 2017/0200671 A1 Jul. 13, 2017

Related U.S. Application Data

(62) Division of application No. 12/970,126, filed on Dec. 16, 2010, now abandoned.

(30) Foreign Application Priority Data

Jun. 4, 2010 (TW) ............................... 99118110 A
Oct. 5, 2010 (TW) ............................... 99133823 A

(51) Int. Cl.

| | |
|---|---|
| ***H01L 23/495*** | (2006.01) |
| ***H01L 23/31*** | (2006.01) |
| ***H01L 23/00*** | (2006.01) |
| ***H01L 21/48*** | (2006.01) |
| ***H01L 21/683*** | (2006.01) |
| ***H01L 21/56*** | (2006.01) |

(52) U.S. Cl.
CPC .... *H01L 23/49582* (2013.01); *H01L 21/4832* (2013.01); *H01L 21/568* (2013.01);
(Continued)

(58) Field of Classification Search
None
See application file for complete search history.

(56) References Cited

U.S. PATENT DOCUMENTS 5,830,800 A 11/1998 Lin
6,087,712 A 7/2000 Kim et al.
(Continued)

*Primary Examiner* — Jay C Chang
(74) *Attorney, Agent, or Firm* — Mintz Levin Cohn Ferris Glovsky and Popeo, P.C.; Peter F. Corless; Steven M. Jensen

(57) ABSTRACT

A method for fabricating a carrier-free semiconductor package includes: half-etching a metal carrier to form a plurality of recess grooves and a plurality of metal studs each serving in position as a solder pad or a die pad; filing each of the recess grooves with a first encapsulant; forming on the metal studs an antioxidant layer such as a silver plating layer or an organic solderable protection layer; and performing die-bonding, wire-bonding and molding processes respectively to form a second encapsulant encapsulating the chip. The recess grooves are filled with the first encapsulant to enhance the adhesion between the first encapsulant and the metal carrier, thereby solving the conventional problem of having a weak and pliable copper plate and avoiding transportation difficulty. The invention eliminates the use of costly metals as an etching resist layer to reduce fabrication cost, and further allows conductive traces to be flexibly disposed on the metal carrier to enhance electrical connection quality.

13 Claims, 11 Drawing Sheets

43 482 44 403 481
45b
45a
402

(52) U.S. Cl.
CPC ...... *H01L 21/6835* (2013.01); *H01L 23/3128* (2013.01); *H01L 23/49548* (2013.01); *H01L 24/16* (2013.01); *H01L 24/32* (2013.01); *H01L 24/48* (2013.01); *H01L 2221/68345* (2013.01); *H01L 2221/68377* (2013.01); *H01L 2224/16225* (2013.01); *H01L 2224/48091* (2013.01); *H01L 2224/48247* (2013.01); *H01L 2224/73265* (2013.01); *H01L 2224/85439* (2013.01); *H01L 2224/92247* (2013.01); *H01L 2224/97* (2013.01); *H01L 2924/00014* (2013.01); *H01L 2924/01046* (2013.01); *H01L 2924/01078* (2013.01); *H01L 2924/01079* (2013.01); *H01L 2924/15311* (2013.01); *H01L 2924/181* (2013.01)

(56) References Cited

U.S. PATENT DOCUMENTS 6,498,099 B1 12/2002 McLellan et al.
6,770,959 B2 8/2004 Huang et al.
6,872,661 B1 3/2005 Kwan et al.
6,933,594 B2 8/2005 McLellan et al.
6,989,294 B1 1/2006 McLellan et al.
7,064,012 B1 * 6/2006 Lin .................... H01L 21/4832 257/E21.175
2004/0177997 A1 9/2004 Hata et al.
2008/0116580 A1 * 5/2008 Jiang .................... H01L 21/561 257/766
2008/0265412 A1 * 10/2008 Hasegawa ............ H01L 21/561 257/737
2009/0034225 A1 2/2009 Shoji et al.
2009/0045512 A1 2/2009 Hedler et al.
2009/0127682 A1 5/2009 Kim et al.
2009/0223046 A1 * 9/2009 Murayama .......... H01L 21/4857 29/847
2010/0314747 A1 12/2010 Low et al.
2011/0156227 A1 * 6/2011 Lin .................... H01L 21/4832 257/676

* cited by examiner

CARRIER-FREE SEMICONDUCTOR PACKAGE AND FABRICATION METHOD

CROSS-REFERENCE TO RELATED APPLICATION(S)

This application is a divisional of copending U.S. application Ser. No. 12/970,126, filed on Dec. 16, 2010, which claims under 35 U.S.C. § 119(a) the benefit of Taiwanese Application No. 99118110, filed on Jun. 4, 2010, and Taiwanese Application No. 99133823, filed on Oct. 5, 2010, the entire contents of which are incorporated herein by reference.

BACKGROUND OF THE INVENTION

1. Field of the Invention

The present invention relates generally to semiconductor packages and fabrication methods thereof, and more particularly, to a carrier-free semiconductor package and a fabrication method thereof.

2. Description of Related Art

Conventionally, there are various kinds of semiconductor packages that use lead frames as chip carriers. Therein, quad flat packages (QFPs) have outer leads for electrical connecting to external devices while quad flat non-leaded (QFN) semiconductor packages dispense with outer leads to reduce the package size. However, limited by encapsulant thickness, the entire height of the QFN semiconductor packages cannot be further reduced to follow the trend of developing thinner and lighter semiconductor devices. Therefore, carrier-free semiconductor packages are developed, which are much thinner and lighter than the conventional lead frame type semiconductor packages.

FIG. 1 shows a carrier-free semiconductor package as disclosed by U.S. Pat. No. 5,830,800. Referring to FIG. 1, the carrier-free semiconductor package is fabricated through the steps of: forming a plurality of electroplated solder pads 12 on a copper plate (not shown); disposing a chip 13 on the copper plate and electrically connecting the chip 13 to the electroplated solder pads 12 through a plurality of bonding wires 14; performing a molding process to form an encapsulant 15; removing the copper plate by etching to expose the electroplated solder pads 12; forming a solder mask layer 11 to define positions of the electroplated solder pads 12 for implanting solder balls 16 to the electroplated solder pads 12 so as to provide a package without a chip carrier. Related techniques are also disclosed in U.S. Pat. Nos. 6,770,959, 6,989,294, 6,933,594 and 6,872,661.

However, the thickness of the electroplated solder pads 12 is only about 1 to 5 μm and the electroplated solder pads 12 has a poor adhesion with the encapsulant 15, which easily leads to a problem of delamination between the electroplated solder pads 12 and the encapsulant 15 and even causes cracking of the bonding wires 14. Further, a costly metal such as gold or palladium is required to form an etching resist layer when the copper plate is removed by etching, thereby increasing the fabrication cost.

In view of the above-described drawbacks, U.S. Pat. No. 6,498,099 discloses another method for fabricating a carrier-free semiconductor package, as shown in FIGS. 2A to 2F, which comprises the steps of: providing a copper plate 20 and half-etching an upper surface of the copper plate 20 so as to form a die pad 21 and a plurality of solder pads 22; plating a nickel or silver layer 203 on the entire upper surface of the copper plate 20; disposing a chip 23 on the die pad 21 and electrically connecting the chip 23 and the solder pads 22 through a plurality of bonding wires 24; forming an encapsulant 25 to cover the chip 23, the solder pads 22 and the upper surface of the copper plate 20; performing an etching process to a lower surface of the copper plate 20 so as to remove a portion of the copper plate, thereby exposing the encapsulant 25; and mounting a plurality of solder balls 26 on a lower surface of the solder pads 22 so as to form a carrier-free semiconductor package.

The above-described fabrication process uses a nickel or silver layer instead of using gold or palladium as an etching resist layer to reduce the fabrication cost. However, since the nickel or silver layer has a poor adhesion with the encapsulant, delamination is easy to occur therebetween under a thermal stress so as to cause permeation of moisture. Further, in the case the package that is already soldered to a printed circuit board 27 needs to be reworked, the solder pads 22 are easy to release from the package due to the poor adhesion between the encapsulant 25 and the silver layer as shown in FIG. 2F, thereby making the entire package become useless. Furthermore, since die-bonding, wire-bonding and molding processes are respectively performed on the half-etched copper, the thickness of the half-etched copper plate has been reduced by half, and thus the half-etched copper plate is so weak and pliable that it is not suitable for transportation and warpage of the copper plate easily occurs under a thermal effect. Moreover, as I/O count increases, wire crossing can easily occur to the array-arranged solder pads 22, thereby resulting in a problem of short circuit.

Therefore, it is imperative to provide a semiconductor package and a fabrication method thereof so as to reduce the fabrication cost and avoid the conventional problems of transportation difficulty, delamination and short circuit.

SUMMARY OF THE INVENTION

In view of the above drawbacks of the prior art, it is an object of the present invention to provide a carrier-free semiconductor package and a fabrication method thereof so as to avoid the use of costly metals such as gold and palladium as an etching resist layer, thereby reducing the fabrication cost.

Another object of the present invention is to provide a carrier-free semiconductor package and a fabrication method thereof so as to prevent delamination of a plating layer from an encapsulant.

A further object of the present invention is to provide a carrier-free semiconductor package and a fabrication method thereof so as to prevent solder pads from dropping from an encapsulant during rework of the semiconductor package.

Still another object of the present invention is to provide a carrier-free semiconductor package and a fabrication method thereof so as to avoid warpage and transportation difficulty of a copper plate.

A further object of the present invention is to provide a carrier-free semiconductor package and a fabrication method thereof, which allows a plurality of conductive traces to be flexibly disposed on a copper carrier so as to effectively shorten the arc length of bonding wires electrically connecting a chip and the conductive traces, thereby enhancing the circuit routability and electrical connection quality of the semiconductor package.

In order to achieve the above and other objects, the present invention provides a carrier-free semiconductor package, which comprises: a plurality of metal studs spaced from each other; a first encapsulant having a top surface and an opposite bottom surface, wherein the sides of the metal studs are encapsulated by the first encapsulant, and the upper and lower surfaces of the metal studs are exposed from the top and bottom surfaces of the first encapsulant, respectively; a semiconductor chip disposed on the top surface of the first encapsulant and electrically connected to the metal studs; and a second encapsulant formed on the top surface of the first encapsulant and encapsulating the semiconductor chip.

The semiconductor chip is electrically connected to the metal studs through bonding wires or in a flip-chip manner.

In another aspect, the present invention further provides a carrier-free semiconductor package, which comprises: a plurality of metal studs spaced from each other; a first encapsulant having a top surface and an opposite bottom surface, wherein the sides of the metal studs are encapsulated by the first encapsulant, and the upper and lower surfaces of the metal studs are exposed from the top and bottom surfaces of the first encapsulant, respectively; a plurality of conductive traces disposed on the top surface of the first encapsulant and electrically connected to the metal studs; a semiconductor chip disposed on the top surface of the first encapsulant and electrically connected to the conductive traces; and a second encapsulant formed on the top surface of the first encapsulant and encapsulating the semiconductor chip and the conductive traces.

The semiconductor chip is electrically connected to the conductive traces through bonding wires or in a flip-chip manner.

In a further aspect, the present invention further provides a carrier-free semiconductor package, which comprises: a plurality of metal studs spaced from each other; a first encapsulant having a top surface and an opposite bottom surface, wherein the sides of the metal studs are encapsulated by the first encapsulant, and the upper and lower surfaces of the metal studs are exposed from the top and bottom surfaces of the first encapsulant, respectively; a plurality of conductive traces disposed on the top surface of the first encapsulant and electrically connected to the metal studs; a second encapsulant formed on the first encapsulant and the conductive traces, each of the conductive traces being at least partially exposed from the second encapsulant; a plurality of build-up traces disposed on the second encapsulant and the exposed conductive traces; a semiconductor chip disposed on the top surface of the second encapsulant and electrically connected to the build-up traces; and a third encapsulant formed on the top surface of the second encapsulant and encapsulating the semiconductor chip and the build-up traces.

The present invention provides a method for fabricating a carrier-free semiconductor package, which comprises the steps of: preparing a metal carrier having a first surface with a plurality of recess grooves and metal studs and a second surface opposite to the first surface; filling the recess grooves with a first encapsulant, the upper surfaces of the metal studs being exposed from the first encapsulant; disposing a semiconductor chip on the first encapsulant and electrically connecting the semiconductor chip to the metal studs; forming a second encapsulant on the first surface of the metal carrier to encapsulate the semiconductor chip; and removing a portion of the metal carrier from the second surface thereof so as to expose the lower surfaces of the metal studs and the bottom surface of the first encapsulant. Further, solder balls can be implanted on the lower surfaces of the metal studs and a singulation process can then be performed.

An antioxidant layer such as a silver plating layer or an organic solderable protection (OSP) film can be formed to cover the upper surfaces of the metal studs exposed from the first encapsulant such that the semiconductor chip can be electrically connected to the metal studs through a wire bonding or flip-chip method.

The present invention further provides a method for fabricating a carrier-free semiconductor package, which comprises the steps of: preparing a metal carrier having a first surface with a plurality of recess grooves and a plurality of metal studs complementary to the recess grooves and a second surface opposite to the first surface; filling the recess grooves with a first encapsulant, the upper surfaces of the metal studs being exposed from the first encapsulant; forming a plurality of conductive traces on the top surface of the first encapsulant and the upper surfaces of the metal studs and electrically connected to the metal studs; disposing a semiconductor chip on the first encapsulant and electrically connecting the semiconductor chip to the conductive traces; forming a second encapsulant on the first surface of the metal carrier to encapsulate the semiconductor chip and the conductive traces; and removing a portion of the metal carrier from the second surface thereof so as to expose the lower surfaces of the metal studs and the bottom surface of the first encapsulant. Further, a plurality of solder balls can be mounted on the lower surfaces of the metal studs and the bottom surface of the first encapsulant, and a singulation process can then be performed.

An antioxidant layer such as a silver plating layer or an OSP film can be formed to cover the terminals of the conductive traces such that the semiconductor chip can be electrically connected to the conductive traces via the plating layer through wire bonding or in a flip-chip manner.

The present invention further provides a method for fabricating a carrier-free semiconductor package, which comprises the steps of: preparing a metal carrier having a first surface with a plurality of recess grooves and a plurality of metal studs complementary to the recess grooves and a second surface opposite to the first surface; filling the recess grooves with a first encapsulant, the upper surfaces of the metal studs being exposed from the first encapsulant; forming a plurality of conductive traces on the top surface of the first encapsulant and the upper surfaces of the metal studs and electrically connected to the metal studs; forming a second encapsulant on the first encapsulant and the conductive traces, each of the conductive traces being partially exposed from the second encapsulant; forming build-up traces on the second encapsulant and the exposed portions of the conductive traces; forming a plating layer on the terminals of the build-up traces; disposing a semiconductor chip on the second encapsulant and electrically connecting the semiconductor chip to the build-up traces; forming a third encapsulant on the second encapsulant to encapsulate the semiconductor chip and the build-up traces; and removing a portion of the metal carrier from the second surface thereof so as to expose the lower surfaces of the metal studs and the bottom surface of the first encapsulant.

Therefore, the carrier-free semiconductor package and a method for fabricating the same of the present invention uses a half-etching method to form on a metal carrier a plurality of recess grooves and metal studs each serving as a die pad or a solder pad, and fills the recess grooves with a first encapsulant such that the first encapsulant is directly attached to the metal carrier (metal studs) made of a material such as copper to thereby enhance the adhesion between the first encapsulant and the metal carrier (metal studs) and to overcome the conventional drawback of dropping of solder pads from an encapsulant during rework of a semiconductor package. The present invention further forms an antioxidant layer such as a silver plating layer or an OSP film on the upper surfaces of the metal studs and performs die-bonding, wire-bonding and molding processes respectively to form a second encapsulant encapsulating the chip. Since the half-etched recess grooves filled up by the first encapsulant add structural strength to the overall metal carrier, transportation difficulty occurring to a conventional weak and pliable copper plate is avoided. Further, the invention eliminates the use of costly metals such as gold and palladium as an etching resist layer to reduce the fabrication cost of the semiconductor package, and further allows a plurality of conductive traces to be flexibly disposed on the metal carrier to enhance the electrical connection quality of the semiconductor package.

BRIEF DESCRIPTION OF DRAWINGS

FIG. 3E' shows another embodiment of the packaging structure, wherein only solder pads are covered with a plating layer; and FIG. 3G' shows a semiconductor package fabricated from the structure of FIG. 3E';

FIGS. 4A' to 4B' are partial views showing a buffer layer formed on the upper surfaces of the first encapsulant and a part of the metal studs;

DETAILED DESCRIPTION OF PREFERRED EMBODIMENTS

The following illustrative embodiments are provided to illustrate the disclosure of the present invention, these and other advantages and effects can be apparent to those in the art after reading this specification.

First Embodiment

Figure 1:
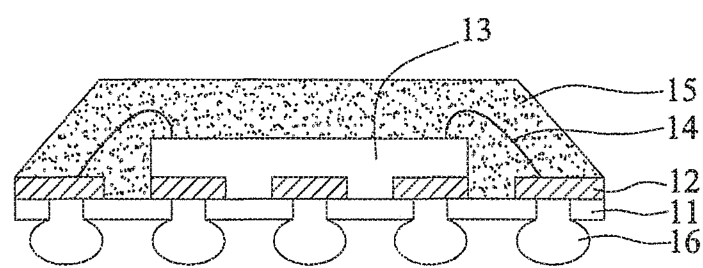
FIG. 1 is a cross-sectional view of a carrier-free semiconductor package disclosed by U.S. Pat. No. 5,830,800.
Figure 2A:
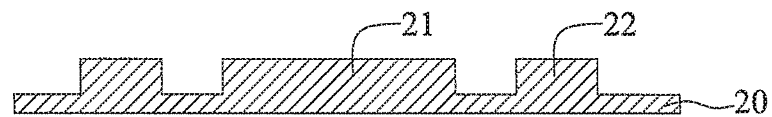
FIGS. 2A to 2E are cross-sectional views showing a method for fabricating a carrier-free semiconductor package disclosed in U.S. Pat. No. 6,498,099.
Figure 2B:
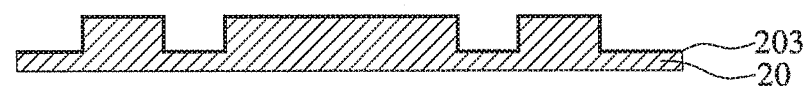
Figure 2C:
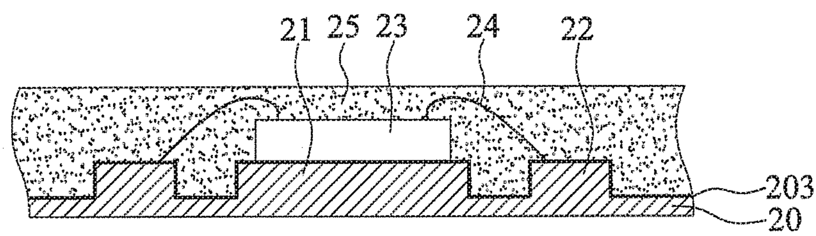
Figure 2D:
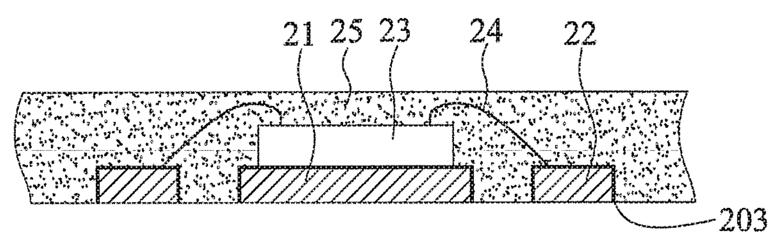
Figure 2E:
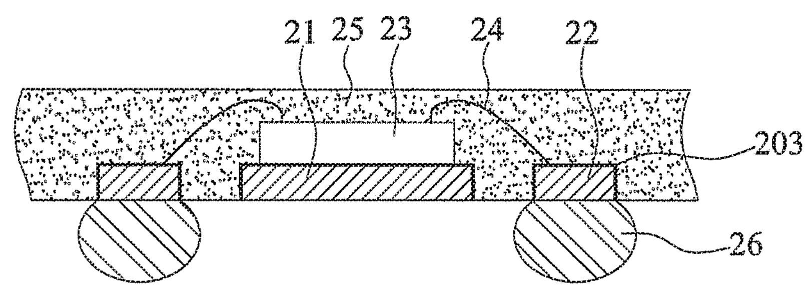
Figure 2F:
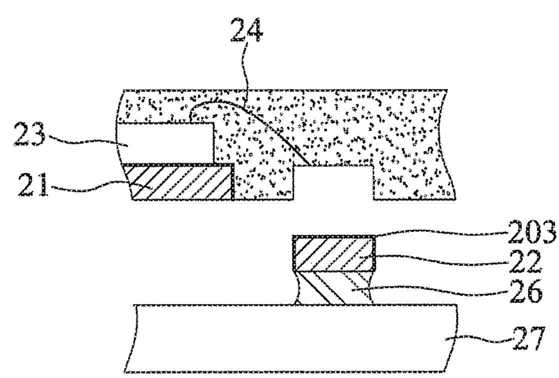
FIG. 2F is a cross-sectional view showing the dropping of a solder pad from an encapsulant during rework of the semiconductor package that is already soldered to a printed circuit board.
Figure 3A:
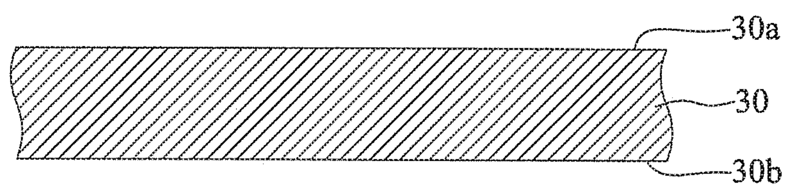
FIGS. 3A to 3G are cross-sectional views showing a carrier-free semiconductor package according to a first embodiment of the present invention, wherein FIG. 3D' is a partially enlarged view of a metal stud with a metal layer formed thereon.
Figure 3B:
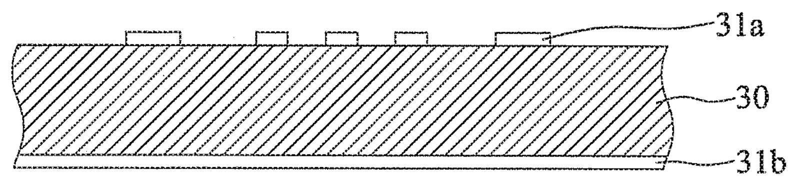
Figure 3C:
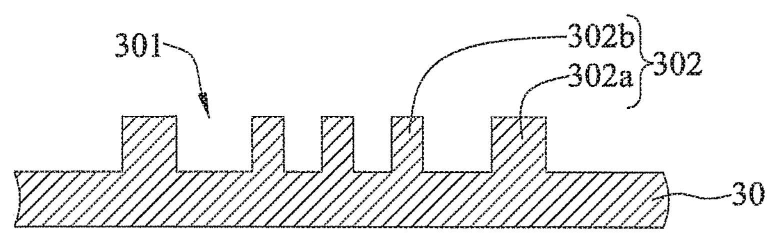
Figure 3D:
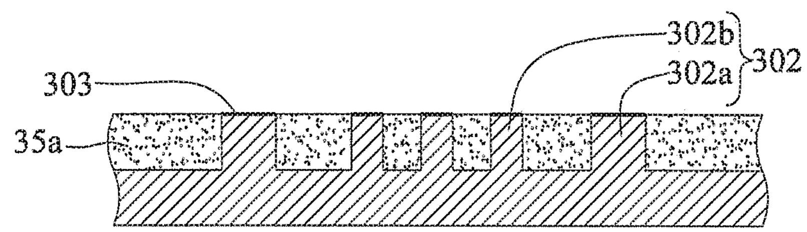
Figure 3D:
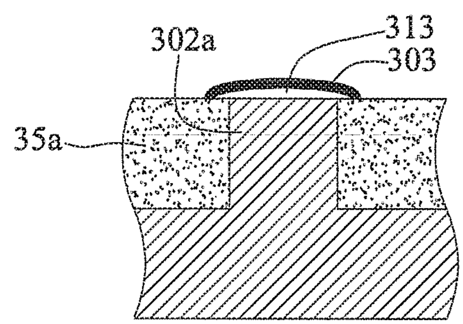

FIGS. 3A to 3G show a carrier-free semiconductor package and a fabrication method thereof according to a first embodiment of the present invention. Referring to FIG. 3A, a metal carrier 30 such as a copper plate is prepared, which has a first surface 30*a* and an opposite second surface 30*b*. Referring to FIG. 3B, a patterned first resist layer 31*a* is formed on the first surface 30*a* of the metal carrier 30 so as to define positions of die pads and solder pads, and a second resist layer 31*b* is formed to cover the second surface 31*b* of the metal carrier 30. Referring to FIG. 3C, a part of the metal carrier 30 not covered by the first resist layer 31*a* is removed through a half-etching process so as to form a plurality of recess grooves 301 and metal studs 302 on the first surface 31*a* of the metal carrier 30. Then, the first resist layer 31*a* and the second resist layer 31*b* are removed. The metal studs 302 serve as solder pads 302*a* and die pads 302*b*, respectively. Referring to FIG. 3D, a first encapsulant 35*a* such as a molding compound, a solder mask or an epoxy resin is filled in the recess grooves 301, and the upper surfaces of the metal studs 302 including those serving as solder pads 302*a* and die pads 302*b* are exposed from the first encapsulant 35*a*.

Figure 3E:
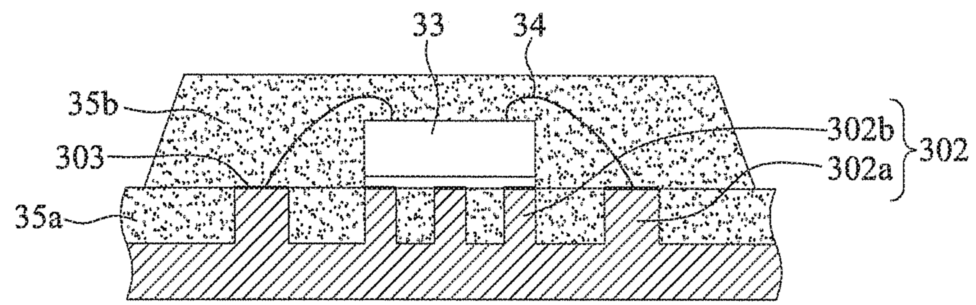
Figure 3E:
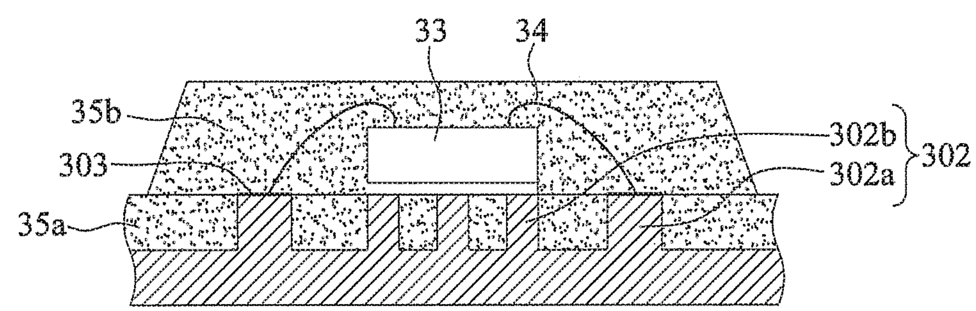

An antioxidant layer such as a silver plating layer 303 is formed by spotting plating so as to cover the upper surfaces of the metal studs 302 exposed from the first encapsulant 35*a*. Alternatively, an organic solderable protection (OSP) film can be formed on the upper surfaces of the metal studs 302 exposed from the first encapsulant 35*a* by dipping. On the other hand, referring to FIG. 3D', before formation of the plating layer 303, a metal layer 313 made of a metal such as copper can be formed on the metal studs 302 such as the solder pads 302*a*, respectively. The metal layer 313 has a thickness of about 3 to 20 μm and a cross-sectional area greater than the corresponding metal studs 302. The metal layer 313 is further encapsulated by the plating layer 303. The metal layer 313 allows the metal studs 302 to be secured in the first encapsulant 35*a* so as to enhance the adhesion between the metal studs 302 and the first encapsulant 35*a*. Referring to FIG. 3E, die-bonding, wire-bonding and molding processes are performed such that a semiconductor chip 33 is disposed on the corresponding die pads 302*b* and electrically connected to the solder pads 302*a* through a plurality of bonding wires 34, and a second encapsulant 35*b* is formed on the upper surfaces of the first encapsulant 35*a* and the metal studs 302 to encapsulate the semiconductor chip 33. In another embodiment, referring to FIG. 3E', the antioxidant layer is only formed on the upper surfaces of the solder pads 302*a* and not on the upper surfaces of the die pads 302*b*. Therefore, the semiconductor chip 33 can be directly disposed on the die pads 302*b* so as to enhance the adhesion between the semiconductor chip 33 and the die pads 302*b*.

Figure 3F:
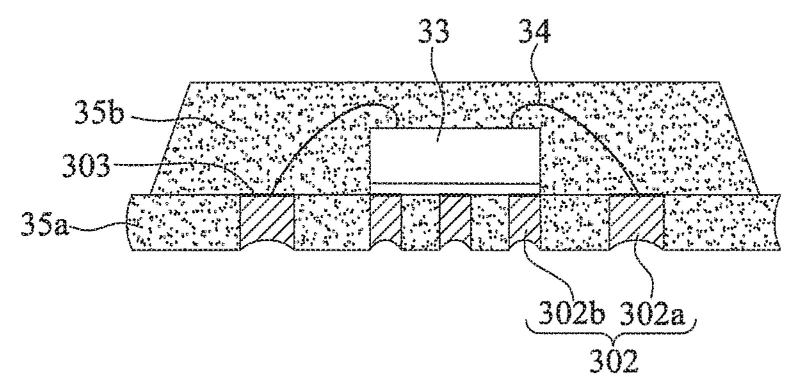

Referring to FIG. 3F, the second surface 30*b* of the metal carrier 30 is etched to expose the lower surfaces of the metal studs 302 and the first encapsulant 35*a*.

Figure 3G:
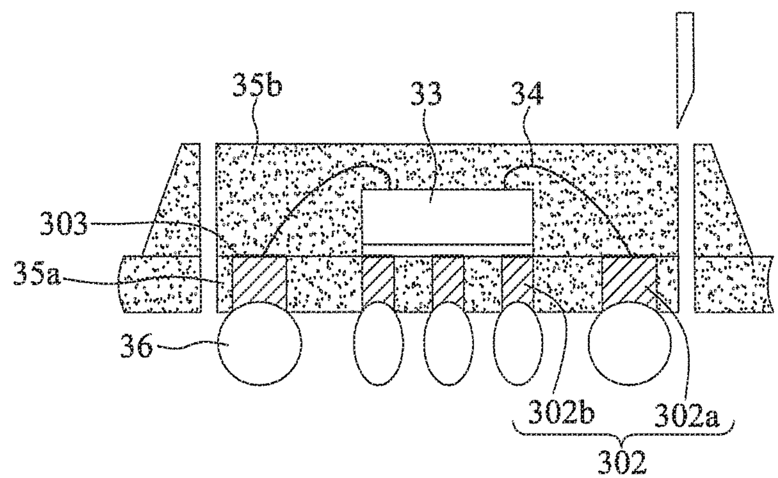
Figure 3G:
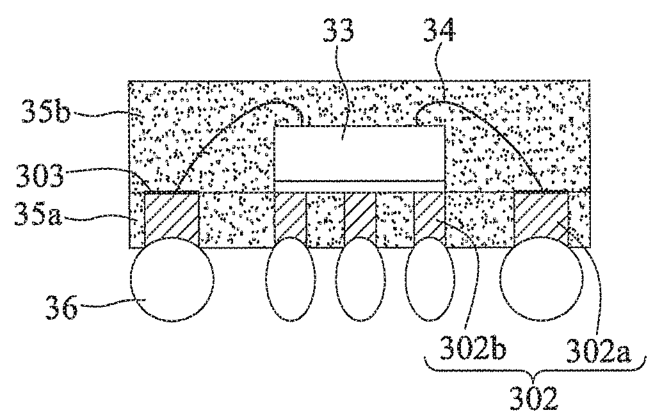

Referring to FIG. 3G a plurality of solder balls 36 is implanted to the lower surfaces of the metal studs 302, respectively, and a singulation process is performed. The solder balls 36 sever as I/O connections for electrically connecting the semiconductor package to an external device.

Through the above-described method, the present invention provides a carrier-free semiconductor package, which comprises: a plurality of metal studs 302 spaced from each other; a first encapsulant 35*a* having a top surface and an opposite bottom surface, the sides of the metal studs 302 being encapsulated by the first encapsulant 35*a* and the upper and lower surfaces of the metal studs 302 being exposed from the top and bottom surfaces of the first encapsulant 35*a*, respectively; a semiconductor chip 33 disposed on the top surface of the first encapsulant 35*a* and electrically connected to the metal studs 302 through a plurality of bonding wires 34; and a second encapsulant 35*b* formed on the top surface of the first encapsulant 35*a* and encapsulating the semiconductor chip 33 and the bonding wires 34, wherein an antioxidant layer, such as a plating layer 303, made of a silver plating layer or an OSP film is disposed on the upper surfaces of the metal studs 302 such that the semiconductor chip 33 is electrically connected to the plating layer 303 through the bonding wires 34, and a plurality of solder balls 36 can be implanted on the lower surfaces of the metal studs 302 so as to electrically connect the semiconductor package to an external device.

Referring to FIG. 3G', a semiconductor package obtained from FIG. 3E' is shown. The antioxidant layer is only formed on the upper surfaces of the solder pads 302*a* and not on the upper surfaces of the die pads 302*b*. As such, the semiconductor chip 33 is directly disposed on the die pads 302*b* so as to enhance the adhesion between the semiconductor chip 33 and the die pads 302*b*.

Therefore, the present invention uses a half-etching method to form on a metal carrier a plurality of recess grooves and metal studs each serving as a die pad or a solder pad, and fills the recess grooves with a first encapsulant such that the first encapsulant is directly attached to the metal carrier (metal studs) made of a material such as copper, thereby enhancing the adhesion between the first encapsulant and the metal carrier (metal studs) and to overcome the conventional drawback of dropping of solder pads from an encapsulant during rework of a semiconductor package. The present invention further forms an antioxidant layer such as a silver plating layer or an OSP film on the upper surfaces of the metal studs and performs die-bonding, wire-bonding and molding processes respectively to form a second encapsulant encapsulating the semiconductor chip. Since the half-etched recess grooves filled up by the first encapsulant add structural strength to the overall metal carrier, transportation difficulty occurring to a conventional weak and pliable copper plate is avoided. Further, the invention eliminates the use of costly metals such as gold and palladium as an etching resist layer, thereby reducing the fabrication cost of the semiconductor package.

Second Embodiment

FIGS. 4A to 4D show a carrier-free semiconductor package and a fabrication method thereof according to a second embodiment of the present invention.

The present embodiment is similar to the first embodiment. A main difference of the present embodiment from the first embodiment is that conductive traces are further formed on the top surface of the first encapsulant and the upper surfaces of the metal studs and electrically connected to the metal studs.

Figure 4A:
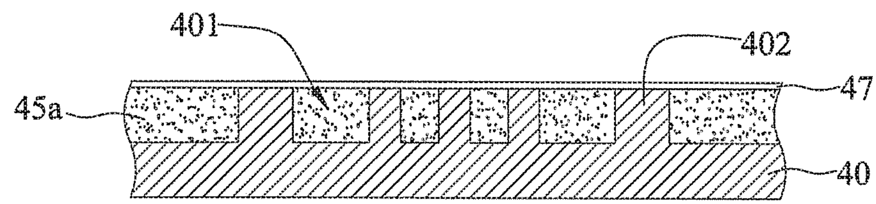
FIGS. 4A to 4D are cross-sectional views showing a carrier-free semiconductor package and a fabrication method thereof according to a second embodiment of the present invention, wherein FIG. 4C' is a top view of FIG. 4C.
Figure 4A:
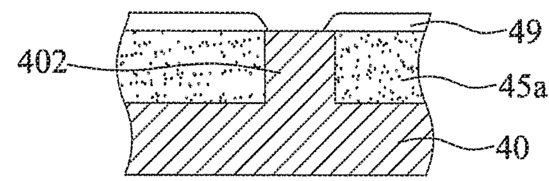

Referring to FIG. 4A, as in the first embodiment, a plurality of recess grooves 401 and metal studs 402 are formed on a first surface of a metal carrier 40, the recess grooves 401 are filled with a first encapsulant 45*a* and the upper surfaces of the metal studs 402 are exposed from the first encapsulant 45*a*. Then, a conductive layer 47 such as a thin copper layer is formed on the top surface of the first encapsulant 45*a* and the upper surfaces of the metal studs 402 by electroless plating or sputtering.

Figure 4B:
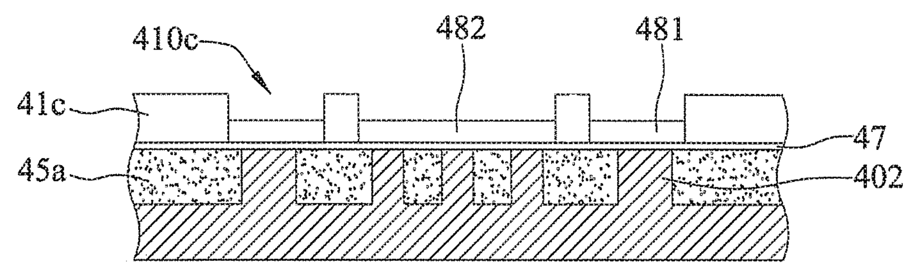
Figure 4B:
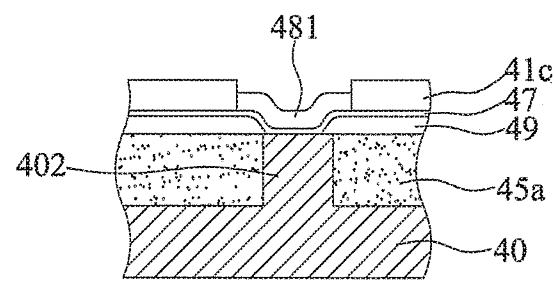

Referring to FIG. 4B, a patterned third resist layer 41*c* is formed on the conductive layer 47 and a plurality of openings 410*c* are formed in the patterned third resist layer 41*c* to define positions of conductive traces and the metal studs 402 serving as die pads. Preferably, the area of the openings 410*c* is greater than the cross-sectional area of the corresponding metal studs 402. Subsequently, a plurality of conductive traces 481 and die pads 482 are formed in the openings 410*c* by electroplating and electrically connected to the metal studs 402.

Figure 4C:
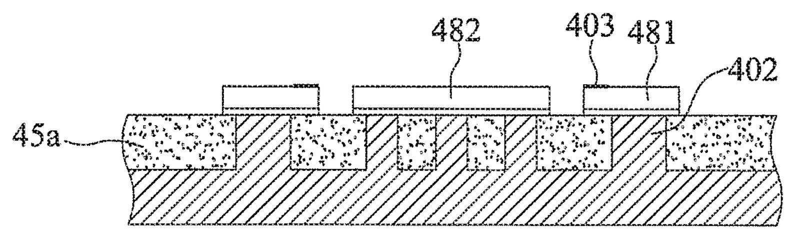
Figure 4C:
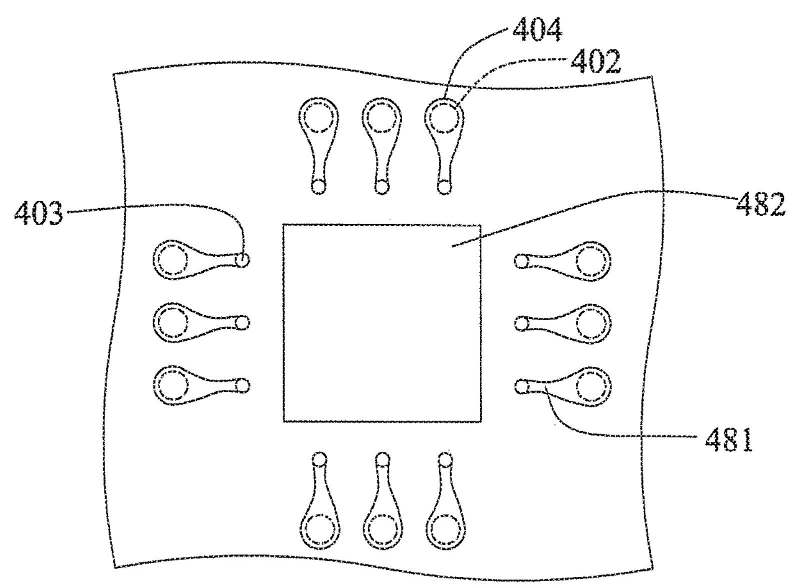

In addition, referring to FIGS. 4A' and 4B', before formation of the conductive traces 481, a patterned buffer layer 49 can be formed on the top surface of the first encapsulant 45*a* and the upper surfaces of the metal studs 402 for exposing the metal studs 402 from the buffer layer 49. The patterned buffer layer 49 is made of benzo-cyclo-butene (BCB) or polyimide (PI). Therefore, the top surface of the first encapsulant 45*a* and the upper surfaces of the metal studs 402 are planarized, and the interlayer stress among the conductive layer 47, the conductive traces 481 and the first encapsulant 45*a* can be released. Referring to FIGS. 4C and 4C', the third resist layer 41*c* is removed, and the conductive layer 47 covered by the third resist layer 41*c* is also removed by etching. An antioxidant layer such as a plating layer 403 made of a silver plating layer or an OSP film is formed on the electrical terminals of the conductive traces 481 by spotting plating or dipping. Referring to FIG. 4C', the plating layer 403 is generally formed close to the die pad 482 so as to facilitate wire bonding. But it is to be understood that the layout of the conductive traces 481 is not limited to the drawing. Further, preferably, the area of the openings 410*c* is greater than the cross-sectional area of the metal studs 402 such that the contact terminals 404 of the conductive traces 481 in respective connection with the metal studs 402 have an area greater than the cross-sectional area of the corresponding metal studs 402.

Figure 4D:
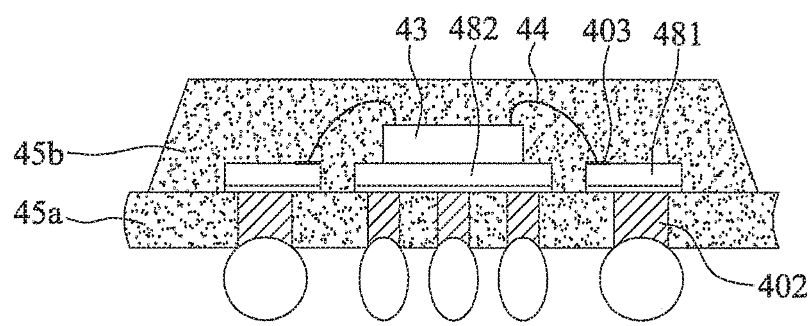

Referring to FIG. 4D, as in the first embodiment, etching, die-bonding, wire-bonding and molding processes are performed such that a semiconductor chip 43 is disposed on the die pad 482 and electrically connected to the plating layer 403 on the terminals (solder fingers) of the conductive traces 481 through bonding wires 44, and a second encapsulant 45*b* is formed to encapsulate the semiconductor chip 43, the conductive traces 481 and the bonding wires 44. As such, a low-cost carrier-free semiconductor package with conductive traces is obtained.

The present embodiment allows conductive traces to be flexibly disposed on a metal carrier corresponding to the integration degree of semiconductor chips and allows conductive traces to extend into the layout area of bonding wires so as to effectively shorten the arc length of the bonding wires electrically connecting a semiconductor chip to the terminals of the conductive traces, thereby shortening the electrical connection path between the semiconductor chip and the conductive traces. As such, the circuit routability and electrical connection quality of the semiconductor package are enhanced and the conventional drawbacks of short circuit and wire bonding difficulty are overcome.

Third Embodiment

Figure 5:
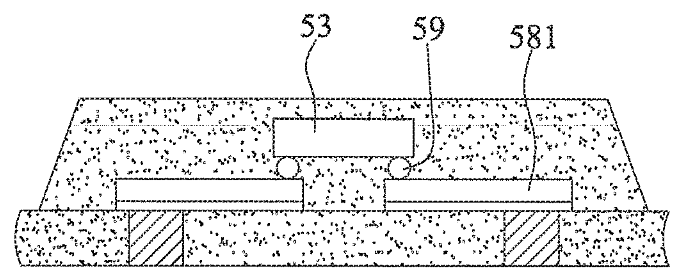
FIG. 5 is a cross-sectional view of a carrier-free semiconductor package according to a third embodiment of the present invention.

FIG. 5 shows a carrier-free semiconductor package and a method for fabricating the same according to a third embodiment of the present invention.

The present embodiment is similar to the above embodiment. A main difference of the present embodiment from the above embodiment is that a semiconductor chip is electrically connected to the terminals of conductive traces via solder bumps in a flip-chip manner.

Referring to FIG. 5, a semiconductor chip 53 is disposed on conductive traces 581 in a flip-chip manner. In particular, the active surface of the semiconductor chip 53 is faced towards the conductive traces 581 and electrically connected to the terminals of the conductive traces 581 through a plurality of solder bumps 59 during the die bonding process.

Compared with a wire bonding packaging structure for connecting the semiconductor chip and the conductive traces, the flip chip packaging structure shortens the electrical connection path between the semiconductor chip and the conductive traces so as to ensure the electrical connection quality between the semiconductor chip and the conductive traces. Further, the inactive surface of the semiconductor chip can be selectively exposed from the second encapsulant encapsulating the semiconductor chip so as to allow heat generated during operation of the semiconductor chip to be effectively dissipated to the outside, thereby enhancing the heat dissipating efficiency of the semiconductor package.

Fourth Embodiment

FIGS. 6A to 6D show a carrier-free semiconductor package and a fabrication method thereof according to a fourth embodiment of the present invention.

The present embodiment is similar to the above-described embodiments. A main difference of the present embodiment from the above-described embodiments is the fabrication method of a metal carrier with recess grooves and metal studs.

Figure 6A:
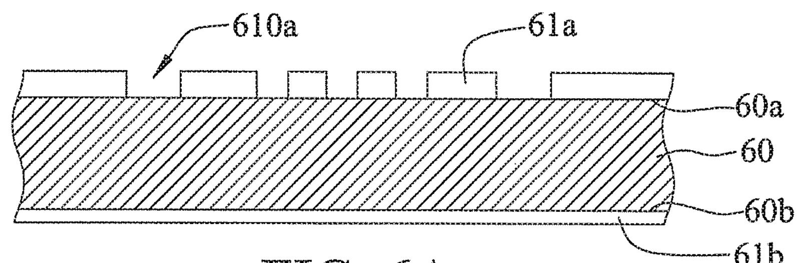
FIGS. 6A to 6D are cross-sectional views showing a carrier-free semiconductor package and a fabrication method thereof according to a fourth embodiment of the present invention.

Referring to FIG. 6A, a metal carrier 60 having a first surface 60*a* and an opposite second surface 60*b* is provided. A patterned first resist layer 61*a* is formed on the first surface 60*a* of the metal carrier 60, and a second resist layer 61*b* is formed to cover the second surface 60*b* of the metal carrier 60, wherein the patterned first resist layer 61*a* has a plurality of openings 610*a* for exposing the metal carrier 60 so as to define the positions of metal studs 602 serving as die pads and solder pads.

Figure 6B:
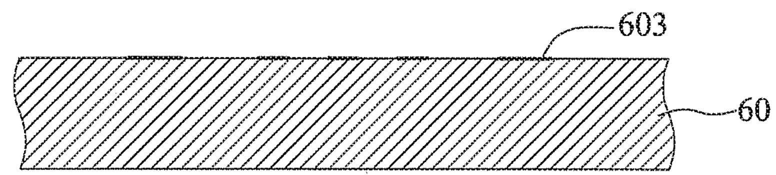

Referring to FIG. 6B, an antioxidant layer such as a silver plating layer 603 is formed in the openings 610*a* of the patterned first resist layer by spotting plating. Then, the first resist layer 61*a* and the second resist layer 61*b* are removed.

Figure 6C:
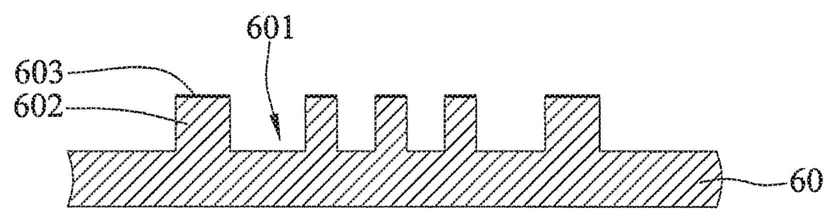

Referring to FIG. 6C, the first surface of the metal carrier 60 is half-etched by using the plating layer 603 as an etching resist layer so as to remove a portion of the metal carrier, thereby forming recess grooves 601 and metal studs 602 on the first surface of the metal carrier 60. Therein, the upper surfaces of the metal studs 602 are covered with the plating layer 603.

Figure 6D:
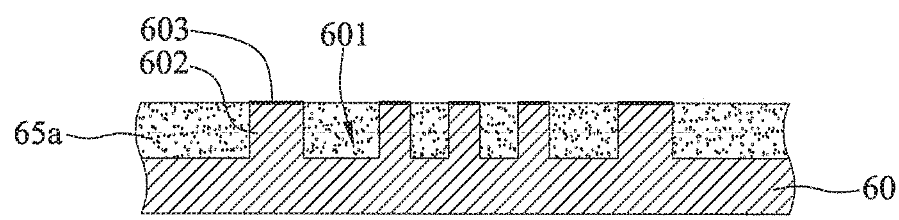

Referring to FIG. 6D, a first encapsulant 65*a* made of one or more polymer materials such as a molding compound, a solder mask or an epoxy resin is filled in the recess grooves 601. And plating layer 603 is exposed from the first encapsulant 65*a*. Subsequent processes are the same as the above-described embodiments and detailed description thereof is omitted herein.

Fifth Embodiment

Figure 7A:
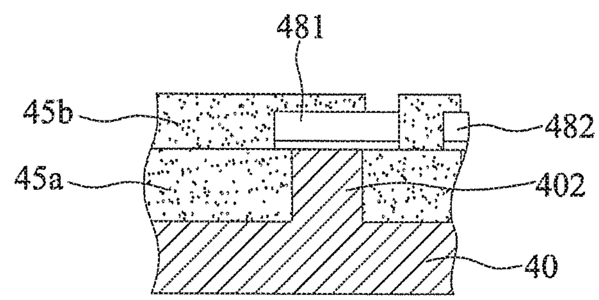
FIGS. 7A to 7C are cross-sectional views showing a method for fabricating a carrier-free semiconductor package according to a fifth embodiment of the present invention, wherein FIG. 7A' to 7C' are partial views showing a buffer layer formed on the upper surface of the first encapsulant according to this embodiment.
Figure 7B:
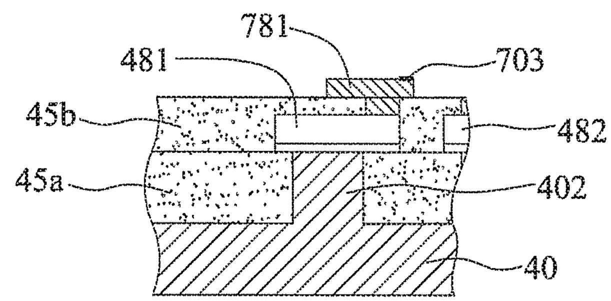
Figure 7C:
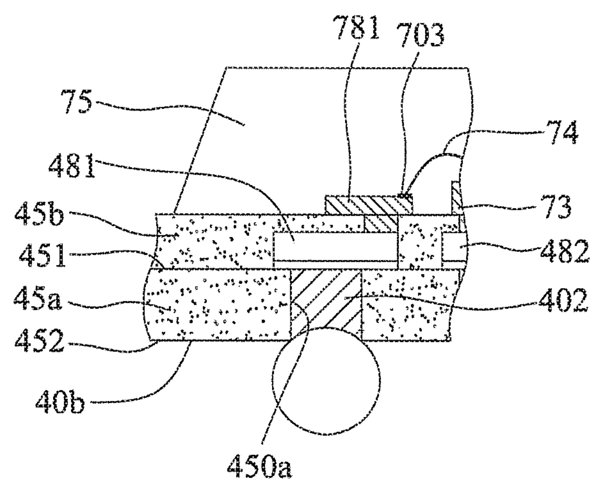
Figure 7A:
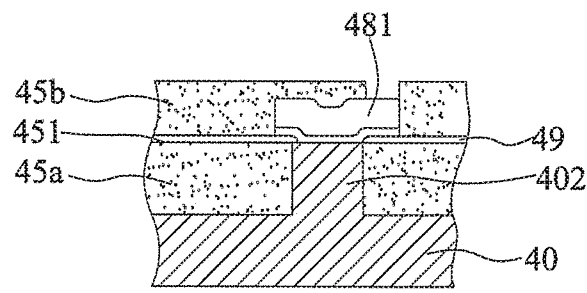
Figure 7B:
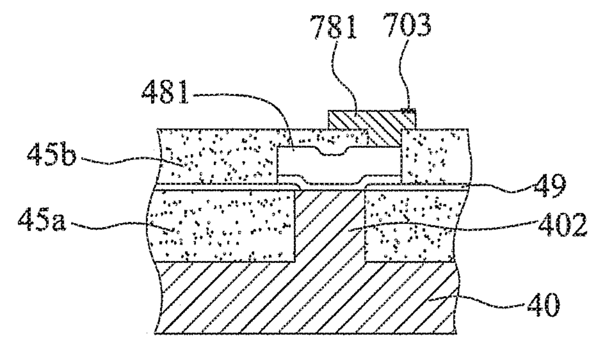
Figure 7C:
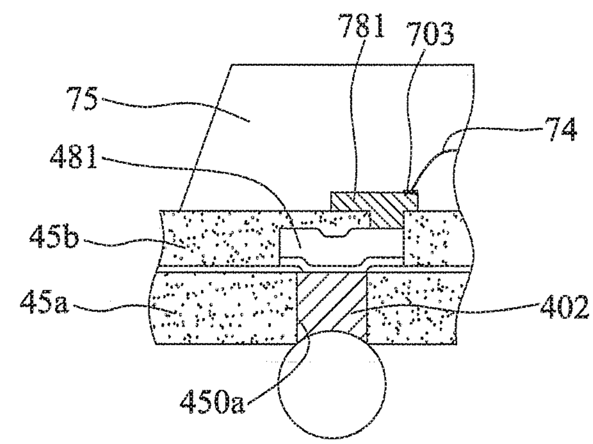

FIGS. 7A to 7C show a carrier-free semiconductor package and a fabrication method thereof according to a fifth embodiment of the present invention.

The present embodiment is similar to the second embodiment. A main difference of the present embodiment from the second embodiment is the formation of build-up traces.

Firstly, as in FIGS. 4A to 4C, a plurality of recess grooves 401 and metal studs 402 are formed on the first surface of a metal carrier 40, the recess grooves 401 are filled with a first encapsulant 45*a* and the metal studs 402 are exposed from the first encapsulant 45*a*, a conductive layer 47 such as a thin copper layer is formed on the upper surfaces of the first encapsulant 45*a* and the metal studs 402 by electroless plating or sputtering. Then, a patterned third resist layer 41*c* is formed on the conductive layer 47 and having a plurality of openings 410*c* for defining positions of the metal studs 402 serving as conductive traces and die pads. Thereafter, a plurality of conductive traces 481 and die pads 482 are formed in the openings 410*c* of the third resist layer 41*c* by electroplating and electrically connected to the metal studs 402. Subsequently, the third resist layer 41*c* is removed and the conductive layer 47 covered by the third resist layer is also removed by etching.

Further referring to FIG. 7A, a second encapsulant 45*b* is formed on the first encapsulant 45*a* and the conductive traces 481. Therein, each of the conductive traces 481 is partially exposed from the second encapsulant 45*b*. For example, the electrical terminal of each of the conductive traces 481 is exposed from the second encapsulant 45*b*. The step of forming the conductive traces 481 further comprises forming die pads 482 on the first encapsulant 45*a* and the metal studs 402, and the second encapsulant 45*b* at least partially exposes the die pads 482.

Referring to FIG. 7B and further referring to the fabricating steps of FIGS. 4A to 4C, build-up traces 781 are formed on the second encapsulant 45*b* and the exposed conductive traces 481, and a plating layer 703 is formed to cover the terminals of the build-up traces 781.

Referring to FIG. 7C, a semiconductor chip 73 is disposed on the second encapsulant 45*b* and electrically connected to the plating layer 703 on the terminals (fingers) of the build-up traces 781 through bonding wires 74. A third encapsulant 75 is formed on the second encapsulant 45*b* to encapsulate the semiconductor chip 73 and the build-up traces 781, and a portion of the metal carrier 40 is removed from the second surface 40*b* thereof so as to expose the lower surfaces of the metal studs 402 and the top surface of the first encapsulant 45*a*. As the above-described embodiments, solder ball implanting and singulation processes are performed to obtain a low-cost carrier-free semiconductor package with conductive traces.

Through the above-described method, the present invention provides a carrier-free semiconductor package, which comprises: a plurality of metal studs 402 spaced from each other; a first encapsulant 45*a* having a top surface 451 and an opposite bottom surface 452, the sides of the metal studs 402 being encapsulated by the first encapsulant 45*a* and the upper and lower surfaces of the metal studs 402 being exposed from the top and bottom surfaces of the first encapsulant 45*a*, respectively; a plurality of conductive traces 481 disposed on the top surface 451 of the first encapsulant 45*a* and electrically connected to the metal studs 402; a second encapsulant 45*b* formed on the first encapsulant 45*a* and the conductive traces 481, wherein each of the conductive traces 481 is partially exposed from the second encapsulant 45*b*; a plurality of build-up traces 781 disposed on the second encapsulant 45*b* and the exposed portion of each of the conductive traces 481; a semiconductor chip 73 disposed on the top surface of the second encapsulant 45*a* and electrically connected to the build-up traces 781; and a third encapsulant 75 formed on the top surface of the second encapsulant 45*b* and encapsulating the semiconductor chip 73 and the build-up traces 781.

In the present embodiment, the carrier-free semiconductor package further comprises the die pads 482 disposed on the upper surface of the first encapsulant 45*a* and electrically connected to the metal studs 402, the upper surfaces of the die pads 482 being partially encapsulated by the second encapsulant 45*b*.

In addition, referring to FIGS. 7A' to 7C', before formation of the conductive traces 481, a patterned buffer layer 49 can further be formed on the top surface 451 of the first encapsulant 45*a* for exposing the metal studs 402 from the buffer layer 49, wherein the patterned buffer layer 49 is made of BCB or PI. Therefore, the top surface of the first encapsulant 45*a* and the upper surfaces of the metal studs 402 are planarized, and the stress among the conductive layer 47, the conductive traces 481 and the first encapsulant 45*a* can be released. The formation of the patterned buffer layer 49 is the same as in the above-described FIGS. 4A' and 4C' and detailed description thereof is omitted herein.

Referring to FIGS. 7A' to 7C', in the formation of the patterned buffer layer 49, the semiconductor package can further include the patterned buffer layer 49 formed and sandwiched among the first encapsulant 45*a*, the conductive traces 481 and the second encapsulant 45*b*, such that each of the metal studs 402 is exposed form the patterned buffer layer 49. The patterned buffer layer 49 is made of BCB or PI. The above-described descriptions of the detailed embodiments are only to illustrate the preferred implementation according to the present invention, and it is not to limit the scope of the present invention, Accordingly, all modifications and variations completed by those with ordinary skill in the art should fall within the scope of present invention defined by the appended claims.

What is claimed is:

1. A carrier-free semiconductor package, comprising:

a plurality of metal studs made of a single carrier material and spaced from each other, wherein each of the plurality of metal studs has a concave curved surface;

a first encapsulant having a top surface and an opposite bottom surface, wherein sides of the metal studs are encapsulated by the first encapsulant, and upper and lower surfaces of the metal studs are exposed from the top and bottom surfaces of the first encapsulant, respectively, wherein the concave curved surface of the metal studs is recessed into the bottom surface of the first encapsulant, the metal studs are flush with the top surface of the first encapsulant, and the lower surfaces of the metal studs are free from being encapsulated by the first encapsulant;

a plurality of conductive traces disposed on the top surface of the first encapsulant and electrically connected to each of the metal studs;

a semiconductor chip disposed on the top surface of the first encapsulant and electrically connected to each of the conductive traces; and a second encapsulant formed on the top surface of the first encapsulant and encapsulating the semiconductor chip and each of the conductive traces.

2. The package of claim 1, further comprising a plurality of solder balls implanted on the lower surfaces of the metal studs, respectively.

3. The package of claim 1, wherein terminals of the conductive traces are covered with a plating layer such that the semiconductor chip is electrically connected to the conductive traces via the plating layer through bonding wires or in a flip-chip manner.

4. The package of claim 3, wherein the plating layer is a silver plating layer or an organic solderable protection film.

5. The package of claim 1, further comprising a plurality of die pads for mounting the semiconductor chip thereon.

6. The package of claim 1, further comprising a patterned buffer layer formed and sandwiched among the first encapsulant, the plurality of conductive traces and the second encapsulant, such that each of the metal studs is exposed from the patterned buffer layer.

7. The package of claim 6, wherein the patterned buffer layer is made of benzo-cyclo-butene or polyimide.

8. A carrier-free semiconductor package, comprising:

a plurality of metal studs made of a single metal carrier material and spaced from each other, wherein each of the plurality of metal studs has a concave curved surface;

a first encapsulant having an top surface and an opposite bottom surface, wherein sides of the metal studs are encapsulated by the first encapsulant, and upper and lower surfaces of the metal studs are exposed from the top and bottom surfaces of the first encapsulant, respectively, wherein the concave curved surface of the metal studs is recessed into the bottom surface of the first encapsulant, the metal studs are flush with the top surface of the first encapsulant, and the lower surfaces of the metal studs are free from being encapsulated by the first encapsulant;

a plurality of conductive traces disposed on the top surface of the first encapsulant and electrically connected to the metal studs;

a second encapsulant formed on the top surface of the first encapsulant and the plurality of conductive traces, each of the conductive traces being at least partially exposed from the second encapsulant;

a plurality of build-up traces disposed on the second encapsulant and the exposed conductive traces;

a semiconductor chip disposed on a top surface of the second encapsulant and electrically connected to the build-up traces; and a third encapsulant formed on the top surface of the second encapsulant and encapsulating the semiconductor chip and each of the build-up traces.

9. The package of claim 8, further comprising a plurality of die pads disposed on the top surface of the first encapsulant and electrically connected to each of the metal studs, upper surfaces of the die pads being partially covered by the second encapsulant.

10. The package of claim 8, wherein each of upper surfaces of the build-up traces is covered with a plating layer such that the semiconductor chip is electrically connected to each of the build-up traces via the plating layer through bonding wires or in a flip-chip manner.

11. The package of claim 10, wherein the plating layer is a silver plating layer or an organic solderable protection film.

12. The package of claim 8, further comprising a patterned buffer layer formed and sandwiched among the first encapsulant, the plurality of conductive traces and the second encapsulant, such that each of the metal studs is exposed from the patterned buffer layer.

13. The package of claim 12, wherein the patterned buffer layer is made of benzo-cyclo-butene or polyimide.

* * * * *